United States Patent [19]

Ishikawa

[11] Patent Number: 5,894,170
[45] Date of Patent: Apr. 13, 1999

[54] WIRING LAYER IN SEMICONDUCTOR DEVICE

[75] Inventor: Hiraku Ishikawa, Tokyo, Japan

[73] Assignee: NEC Corporation, Tokyo, Japan

[21] Appl. No.: 08/912,067

[22] Filed: Aug. 15, 1997

[30] Foreign Application Priority Data

Aug. 29, 1996 [JP] Japan ................... 8-229130

[51] Int. Cl.$^6$ .................. H01L 23/48; H01L 23/52; H01L 29/40
[52] U.S. Cl. ............... 257/775; 257/774; 257/776; 257/758
[58] Field of Search ............... 257/775, 774, 257/776, 758, 692, 786, 202, 210

[56] References Cited

U.S. PATENT DOCUMENTS

| 5,075,753 | 12/1991 | Kozono ................... 257/774 |
| 5,748,550 | 5/1998 | Jeon et al. ............... 257/774 |

FOREIGN PATENT DOCUMENTS

| 60-176251 | 9/1985 | Japan ................... 257/775 |
| 2-22843 | 1/1990 | Japan . |
| 4-280457 | 10/1992 | Japan . |
| 5-226256 | 9/1993 | Japan . |
| 6-5856 | 1/1994 | Japan ................... 257/775 |
| 8-195395 | 7/1996 | Japan . |

*Primary Examiner*—Mahshid Saadat
*Assistant Examiner*—Jhihan B. Clark
*Attorney, Agent, or Firm*—Young & Thompson

[57] ABSTRACT

A semiconductor device includes (a) a semiconductor substrate, (b) a first interlayer insulating film formed on the semiconductor substrate, (c) a wiring layer having a thickness T and a width W1 greater than the thickness T formed on the first interlayer insulating film, the wiring layer being divided into a plurality of wiring layer segments each of which has a width W2 equal to or smaller than the thickness T, and (d) a second interlayer insulating film covering the wiring layer segments therewith. The semiconductor device ensures that even when a second interlayer insulating film is formed on a wiring layer by means of bias sputtering or bias CVD, projections are not formed on the second interlayer insulating film above the wiring layer. Namely, it is possible to completely planarize the second interlayer insulating film.

16 Claims, 6 Drawing Sheets

WIRING LAYER IN SEMICONDUCTOR DEVICE

BACKGROUND OF THE INVENTION

1. Field of the Invention

The invention relates to a semiconductor and a method of fabricating the same, and more particularly to a wiring layer made of metal such as gold and a method of fabricating the same.

2. Description of the Related Art

As semiconductor elements become smaller, it is absolutely necessary to use a multi-layer wiring structure. An interlayer insulating film for a semiconductor device having such a multi-layer wiring structure, may include an insulating film made of silicon dioxide having a small dielectric constant and uniform quality for reducing parasitic capacitance between an upper wiring layer and a lower wiring layer or between wirings in a common wiring layer.

Further, as semiconductor elements become smaller, a width of wirings in a lower wiring layer and a spacing between adjacent wirings in a wiring layer are smaller. However, a wiring is required to have a cross-sectional area greater than a certain value in order to avoid increasing wiring resistance. As a result, an aspect ratio of the wiring defined by a thickness of the wiring divided by a width of the wiring, and an aspect ratio between wirings defined by a thickness of the wiring divided by a spacing between the wiring and an adjacent wiring both increase. In addition, it is required to planarize a surface of an interlayer insulating film which covers a lower wiring layer. If there were a large step at a surface of an interlayer insulating film, it would not be possible to form a fine photoresist pattern because of shortage of a focus margin in photolithography, when an upper wiring layer is formed on such an interlayer insulating film. The large step would bring problems of breakage of an upper wiring layer and generation of etching residue of material of which an upper wiring layer is made. For those reasons, an interlayer insulating film to be formed covering a lower wiring layer is required to have a flat surface.

In addition, when an interlayer insulating film is formed covering a wiring layer made of aluminum, a temperature at which an interlayer insulating film is formed has to be equal to or smaller than about 450° C., which is a melting point of aluminum.

Bias sputtering and chemical vapor deposition (CVD) employing bias ECR may be used to form an interlayer insulating film for a multi-layer wiring structure made of aluminum or similar metal. The bias sputtering and bias ECR CVD correspond to improved sputtering and ECR plasma. According to the bias sputtering and bias ECR CVD techniques, projections of an interlayer insulating film which are formed simultaneously with deposition of an interlayer insulating film are cut off by virtue of a bias voltage. Thus, an interlayer insulating film is planarized at its upper surface.

However, bias sputtering and bias ECR have a problem that an interlayer insulating film formed on a wiring having a narrow width can be readily planarized, but an interlayer insulating film formed on a wiring having a wide width is quite difficult or impossible to planarize.

The above mentioned problem is explained hereinbelow in detail with reference to FIGS. 1 and 2. FIG. 1 is a plan view of a wiring layer constituted of three wirings 103, 104 and 105, and FIG. 2 is a cross-sectional view taken along the line II—II in FIG. 1.

As illustrated in FIG. 1, there are formed three wirings 103, 104 and 105 on a silicon substrate. Specifically, as illustrated in FIG. 2, a first interlayer insulating film 102 is formed on a silicon substrate 101, and the wirings 103, 104 and 105 are formed on the first interlayer insulating film 102. The wirings 103, 104 and 105 make a wiring layer. The wirings 103, 104 and 105 have a common thickness, but have different widths. That is, the wiring 104 is greater than the wiring 103 in width, and the wiring 105 is greater than the wiring 104 in width.

A second interlayer insulating film 106 is formed on the wirings 103 to 105 by bias sputtering or bias ECR-CVD so that the second interlayer insulating 106 fully covers the wirings 103 to 105. As illustrated in FIG. 2, the second interlayer insulating film 106 has a completely flat surface above the wiring 103 having the smallest width among the wirings. In contrast, there is produced a triangular projection 107a at a surface of the second interlayer insulating film 106 above the wiring 104 having a width greater than that of the wiring 103. Similarly, there is produced a trapezoidal projection 107b at a surface of the second interlayer insulating film 106 above the wiring 105 having a width much greater than that of the wiring 103.

As mentioned earlier, bias sputtering and bias ECR-CVD are quite useful for forming an interlayer insulating film, when there is fabricated a semiconductor device having a multi-layer wiring structure. However, when an interlayer insulating film is formed by those methods, it would be quite difficult to planarize the interlayer insulating film above wirings having a wide width, as having been explained with reference to FIGS. 1 and 2.

As a result, when an upper wiring layer is formed on an interlayer insulating film as the film 106 illustrated in FIG. 2, the upper wiring layer may be broken or may have an undesirable pattern. Such a problem is more remarkable, as a multi-layer wiring structure is made smaller in size.

In addition, if a through hole is intended to form throughout such an interlayer insulating film as the film 106 illustrated in FIG. 2, it is often impossible to form a through hole passing through projections formed on an interlayer insulating film, such as the triangular projection 107a and the trapezoidal projection 107b illustrated in FIG. 2.

One of solutions to the above mentioned problems has been suggested in Japanese Unexamined Patent Publication No. 2-22843 published on Jan. 25, 1990. The Publication suggests a semiconductor device comprising a semiconductor substrate, a first electrode or wiring formed on the substrate, an interlayer insulating film formed over the first electrode or wiring, and a second wiring formed on the interlayer insulating film, the second wiring being in electrical connection with the first electrode or wiring through a contact hole, characterized by a split pattern contact through which the first electrode or wiring makes contact with the second wiring.

However, the above mentioned Publication does not fully overcome the problems as mentioned above.

SUMMARY OF THE INVENTION

It is an object of the present invention to provide a semiconductor device in which when an interlayer insulating film is formed on wirings having a wider width by means of bias sputtering or bias ECR-CVD, projections are not produced on a surface of the interlayer insulating film above the wirings.

It is also an object of the present invention to provide a method of fabricating such a semiconductor device as mentioned above.

In one aspect, there is provided a semiconductor device including (a) a semiconductor substrate, (b) a first interlayer insulating film formed on the semiconductor substrate, (c) a wiring layer having a thickness T and a width greater than the thickness T, and formed on the first interlayer insulating film, the wiring layer being divided into a plurality of wiring layer segments each of which has a width equal to or smaller than the thickness T, the wiring layer being constituted of the wiring layer segments, and (d) a second interlayer insulating film formed covering the wiring layer segments therewith.

There is further provided a wiring layer formed in a semiconductor device, including a plurality of wiring layer segments each of which is continuous with adjacent ones and each of which has a width equal to or smaller than a thickness T of the wiring layer, total width of the wiring layer segments being greater than the thickness T.

There is still further provided a semiconductor device including (a) a semiconductor substrate, (b) a diffusion layer formed in the semiconductor substrate and having electrical conductivity opposite to that of the semiconductor substrate, (c) a first interlayer insulating film formed on the semiconductor substrate, (d) a contact pad formed on the first interlayer insulating film, (e) a contact plug formed throughout the first interlayer insulating film in a thickness-wise direction for electrically connecting the diffusion layer to the contact pad, (f) a lower wiring layer having a thickness T and a width W1 greater than the thickness T, and formed on the contact plug, the wiring layer being divided into a plurality of wiring layer segments each of which has a width W2 equal to or smaller than the thickness T, the wiring layer being constituted of the wiring layer segments, (g) a second interlayer insulating film formed covering the wiring layer segments therewith, the second interlayer insulating film being formed with a through hole through which sidewalls and a part of upper surfaces of the wiring layer segments are exposed, and (h) an upper wiring layer formed filling the opening therewith to make contact with the wiring layer segments at sidewalls and at least a part of upper surfaces thereof.

It is preferable that the contact pad is wider than the through hole. As an alternative, the contact pad may be formed so that the contact pad covers at least a region below which the contact plug does not exist, but on which the through hole exists and the wiring layer segments do not exist.

For instance, the wiring layer may be formed with spaces where the wiring layer does not exist, to thereby define the wiring layer segments.

It is preferable that the spaces are formed in a line or in lines arranged in parallel with each other, in which latter case it is preferable that spaces in a line are arranged alternately with spaces in an adjacent line.

The spaces may have various shapes. For instance, the spaces may be square, circular, rectangular or oval in shape, or a combination of various shapes. By forming the spaces as mentioned above, the wiring layer segments may be shaped in a mesh.

It is preferable that the second interlayer insulating film is made of either a silicon dioxide film deposited by bias-ECR CVD or a silicon dioxide film deposited by bias sputtering.

In another aspect, there is provided a method of fabricating a semiconductor device, including the steps of (a) forming a first interlayer insulating film on a semiconductor substrate, (b) forming the first interlayer insulating film with a through hole extending in a thickness-wise direction, (c) filling the through hole with a first electrically conductive film, (d) forming a second electrically conductive film on the first interlayer insulating film in electrical connection with the first electrically conductive film, and (e) forming a lower wiring layer on the second electrically conductive film, the wiring layer constituted of wiring layer segments, each of the wiring layer segments corresponding to a segment obtained when the lower wiring layer is divided into a pattern.

The method may further include the steps of (f) forming a second interlayer insulating film over the wiring layer segments, (g) dry-etching the second interlayer insulating film with the second electrically conductive film acting as an etching stopper to thereby form a through hole extending throughout a thickness of the second interlayer insulating film, and (h) filling the through hole with a third electrically conductive film as an upper wiring layer.

It is preferable that the third electrically conductive film makes contact with the wiring layer segments at sidewalls and at least a part of upper surfaces thereof.

In the above mentioned method, assumed that the lower wiring layer has a thickness T and a width W1 greater than the thickness T, each of the wiring layer segments may have a width W2 equal to or smaller than the thickness T.

Similarly to the above mentioned semiconductor device, the lower wiring layer may be formed with spaces where the lower wiring layer does not exist, to thereby define the wiring layer segments. The spaces may be formed in a line or in lines arranged in parallel with each other. The spaces may be square, circular, rectangular, oval or other any shapes in shape, or a combination thereof in shape.

In accordance with the above mentioned invention, a wiring having a width greater than a thickness thereof is divided into segments having a width smaller than a thickness thereof. Thus, the wiring is constituted of a plurality of the segments. Hence, when a second interlayer insulating film is formed on the wiring by means of bias sputtering or bias ECR-CVD, no projections are made on a surface of the second interlayer insulating film above the segments, ensuring that the second interlayer insulating film can have a completely flat upper surface, which further ensures reduction in time for fabricating a semiconductor device. As a result, it would be possible to reduce fabrication costs for fabricating a semiconductor device, and enhance a fabrication yield and reliability.

There may be formed a contact pad made of an electrically conductive film at a contact hole region, namely a region through which a wiring layer divided into a plurality of the segments makes contact with an upper or lower wiring layer. The contact pad prevents an increase in contact resistance between the wiring layer divided into the segments and an upper or lower wring layer. That is, even if the present invention is applied to a semiconductor device, a wiring resistance is never increased.

Thus, the present invention facilitates formation of a semiconductor device in a multi-layer wiring structure, and makes it easy to fabricate a semiconductor device with higher integration or higher density.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 3A:
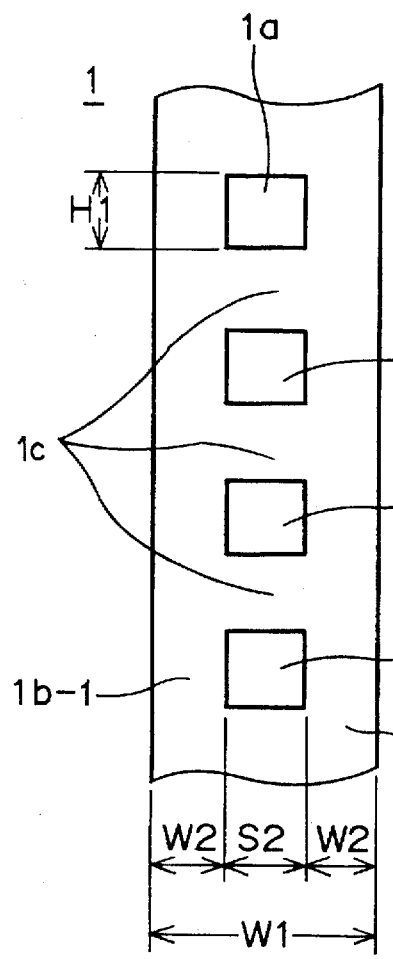
FIG. 3A is a top plan view illustrating a wiring layer in accordance with the first embodiment of the present invention.

FIG. 3A illustrates a wiring layer in a semiconductor device in accordance with the first embodiment of the present invention. An illustrated wiring layer 1 made of aluminum-copper alloy has a width W1 greater than a thickness T thereof. The wiring layer 1 is formed with a plurality of square spaces 1a, that is, regions where the wiring layer 1 does not exist. The square spaces 1a are equally spaced away from adjacent spaces, and arranged in a line. The spaces 1a are all the same in size, namely the spaces 1a have the same width S1 and the same height H1.

By forming the spaces 1a within the wiring layer 1, the wiring layer 1 is divided into two wiring layer segments 1b–1 and 1b–2 extending at opposite sides of the spaces 1a. Each of the wiring layer segments 1b–1 and 1b–2 extend in a line in the same direction as a direction in which the wiring layer 1 extends. The wiring layer segments 1b–1 and 1b–2 are connected with each other through connections 1c formed between adjacent spaces 1a.

The wiring layer segments 1b–1 and 1b–2 are designed to have a width W2 which is equal to or smaller than the thickness T of the wiring layer 1. Thus, the wiring layer 1 is constituted of the wiring layer segments 1b–1 and 1b–2 both having a smaller width than the thickness of the wiring layer 1.

For instance, assumed that the wiring layer 1 has a thickness T of 1.5μm and a width W1 of 3μm, the spaces 1a are designed to have a width S1 of 1μm and the wiring layer segments 1b–1 and 1b–2 are designed to have a width W2 of 1μm which is smaller than the thickness of 1.5μm.

Figure 3B:
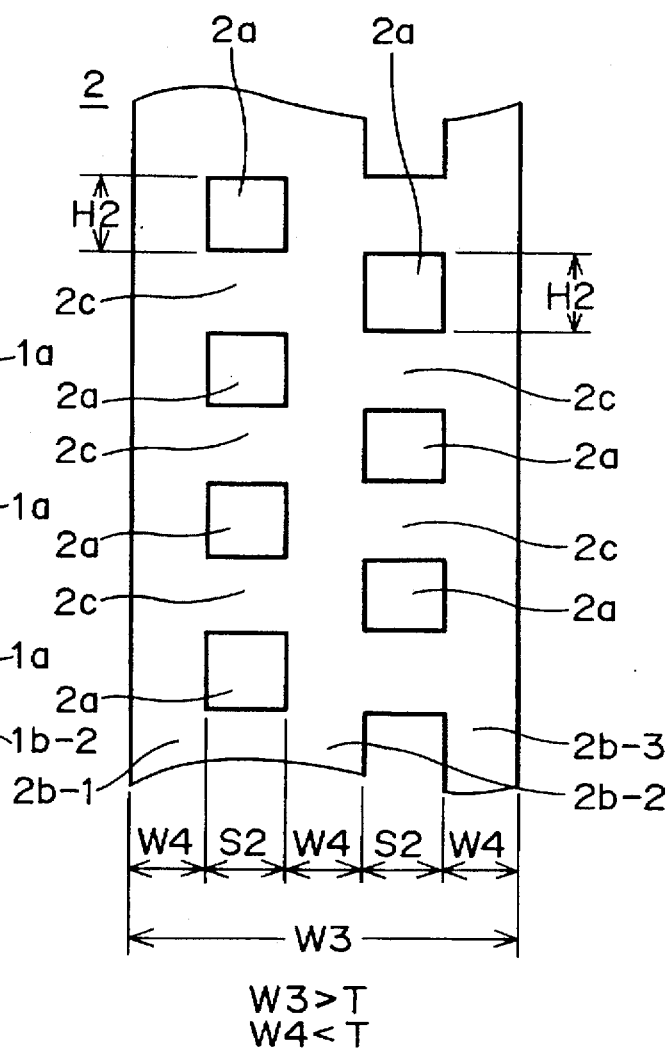
FIG. 3B is a top plan view illustrating a variant of the wiring layer illustrated in FIG. 3A.

FIG. 3B illustrates a variant of the first embodiment illustrated in FIG. 3A. An illustrated wiring layer 2 made of aluminum-copper alloy has a width W3 which is wider than the width W1 of the wiring layer 1 illustrated in FIG. 3A and which is further greater than a thickness T of the wiring layer 2. The wiring layer 2 is formed with a plurality of square spaces 2a in a plurality of lines. The lines along which the spaces 2a are arranged are in parallel with each other, and in each of the lines, the square spaces 2a are equally spaced away from adjacent spaces. The spaces 2a are all the same in size, namely the spaces 2a have the same width S2 and the same height H2.

By forming the spaces 2a within the wiring layer 2, the wiring layer 2 is divided into three wiring layer segments 2b–1, 2b–2 and 2b–3 located at opposite sides of the spaces 2a. Each of the wiring layer segments 2b–1, 2b–2 and 2b–3 extend in a line in the same direction as a direction in which the wiring layer 2 extends. The wiring layer segments 2b–1, 2b–2 and 2b–3 are connected with each other through connections 2c formed between the adjacent spaces 2a.

The spaces 2a in a line are arranged alternately with the spaces 2a in an adjacent line. Specifically, the spaces 2a in a certain line are in alignment with the connections 2c located in an adjacent line.

The wiring layer segments 2b–1, 2b–2 and 2b–3 are designed to have a width W4 which is equal to or smaller than the thickness T of the wiring layer 2. Thus, the wiring layer 2 is constituted of the wiring layer segments 2b–1, 2b–2 and 2b–3 each having a smaller width than the thickness of the wiring layer 2.

For instance, assumed that the wiring layer 1 has a thickness T of 1.5μm and a width W1 of 5 μm, the spaces 2a are designed to have a width S2 of 1μm and the wiring layer segments 2b–1, 2b–2 and 2b–3 are designed to have a width W4 of 1μm which is smaller than the thickness T of 1.5μm.

In the variant illustrated in FIG. 3B, the wiring layer segments 2b–1, 2b–2 and 2b–3 are designed to have the same width W4, but it should be noted that the wiring layer segments 2b–1, 2b–2 and 2b–3 may have different widths from one another, as long as each of the widths of the wiring layer segments 2b–1, 2b –2 and 2b–3 is smaller than the thickness T of the wiring layer 2.

As an alternative to making a difference in a width among the wiring layer segments 2b–1, 2b–2 and 2b–3, the spaces 2a in a certain line may be designed to have a different width from a width of the spaces in other lines.

Though not illustrated, if a wiring layer has a greater width than the width W3 of the wiring layer 2 illustrated in FIG. 3B, the greater number of the square spaces 2a are formed. Hence, the wiring layer segments are formed in a mesh pattern.

As mentioned above, a wiring layer having a width greater than a thickness thereof is divided into a plurality of wiring layer segments, and the wiring layer is constituted of a group of the thus divided wiring layer segments having a width equal to or smaller than the thickness of the wiring layer.

Figure 1:
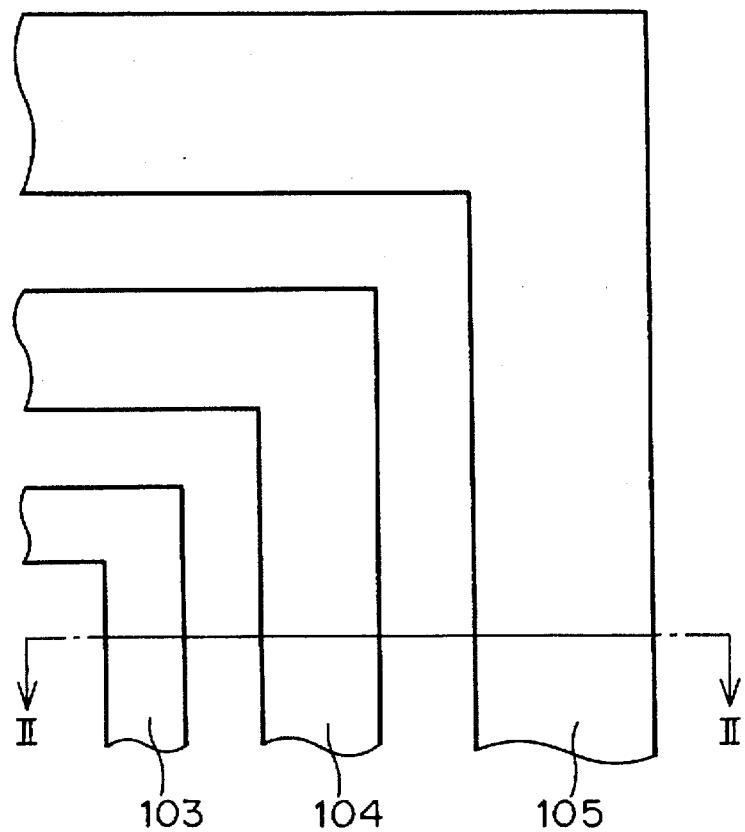
FIG. 1 is a top plan view of a conventional wiring layer.
Figure 2:
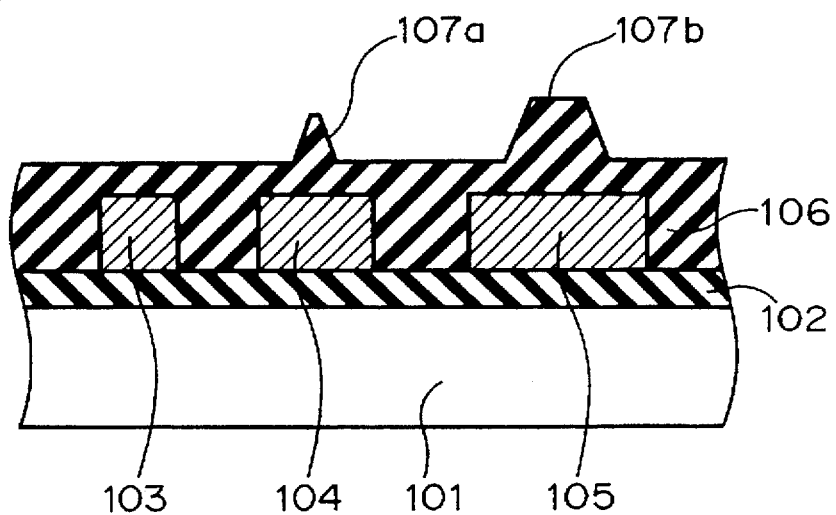
FIG. 2 is a cross-sectional view taken along the line II—II in FIG. 1.

Hereinbelow is explained, with reference to FIGS. 4A and 4B, a relationship between a width and a thickness of a wiring layer above which projections such as the projections 107a and 107b illustrated in FIG. 2 are not formed. The relationship explained hereinbelow is based on the results of the experiments which the inventor had conducted.

Figure 4A:
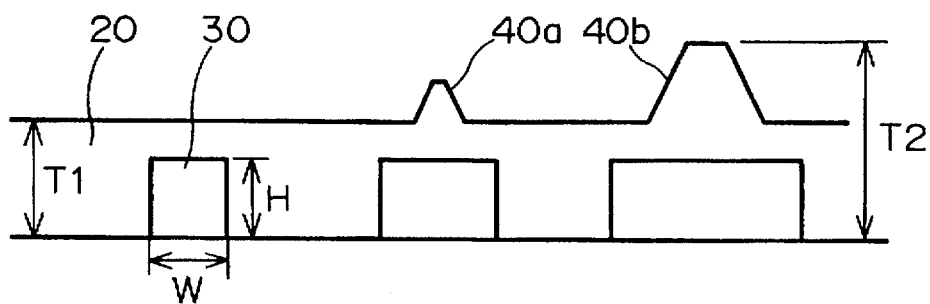
FIG. 4A is a cross-sectional view illustrating wirings having a common thickness, but having different widths.

FIG. 4A illustrates an interlayer insulating film 20 made of a silicon dioxide film formed by CVD employing bias ECR. As indicated in FIG. 4A, it is assumed that the interlayer insulating film 20 has a thickness T1 where projections 40a and 40b are not formed, and has a thickness T2 where projections 40a and 40b are formed. It is also assumed that a wiring layer 30 has a width W and a thickness H.

Herein, a ratio of a thickness of the wiring layer 30 where projections are formed to a thickness of the wiring layer 30 where the projections 40a and 40b are not formed is represented with T2/T1. FIG. 4B illustrates a graph showing a relation between the ratio T2/T1 and the width W of the wiring layer 30.

When the width W is equal to or smaller than the thickness H of the wiring layer 30, there are not formed the projections 40a and 40b, in which case the ratio T2/T1 is always one (1).

When the width W is greater than the thickness H of the wiring layer 30, but smaller than double thickness 2H, there is formed the triangular projection 40a on a surface of the interlayer insulating film 20 above the wiring layer 30. Hence, when the width W is between H and 2H, the ratio T1/T2 linearly increases, as the width W of the wiring layer 30 increases.

Figure 4B:
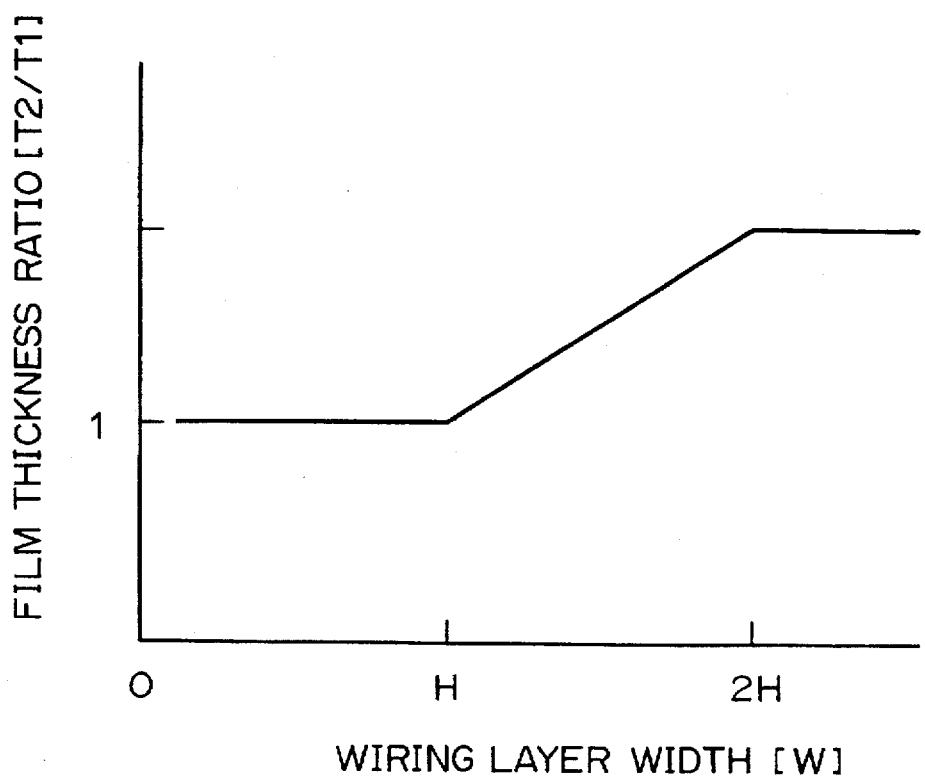
FIG. 4B is a graph showing the dependency of the planarization of an interlayer insulating film on a width of a wiring.

When the width W is greater than the double thickness 2H, there is formed the trapezoidal projection 40b, in which case the ratio T2/T1 is over one As is obvious in view of the graph illustrated in FIG. 4B, if the ratio T2/T1 is greater than one (1), there are formed the triangular or trapezoidal projections 40a or 40b on a surface of the interlayer insulating film 20, but if the ratio T2/T1 is equal to or smaller than one (1), there are not formed the projections. In other words, with a wiring layer having a width equal to or smaller than a thickness thereof, projections are not formed on a surface of an interlayer insulating film above the wiring layer. The same is true in the case where an interlayer insulating film made of a silicon dioxide film is formed by bias sputtering.

This means that if a wiring layer having a width greater than a thickness thereof is divided into segments having a width equal to or smaller than a thickness of the wiring layer, it would be possible for an interlayer insulating film to be formed above the segments to have a completely flat surface.

Figure 5A:
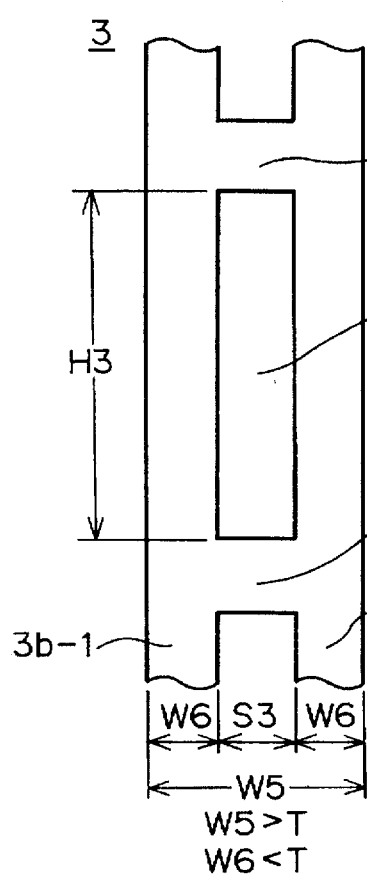
FIG. 5A is a top plan view illustrating a wiring layer in accordance with the second embodiment of the present invention.

FIG. 5A illustrates a wiring layer in a semiconductor device in accordance with the second embodiment of the present invention. An illustrated wiring layer 3 made of aluminum-copper alloy has a width W5 greater than a thickness T thereof. The wiring layer 3 is formed with a plurality of rectangular spaces 3a. The rectangular spaces 3a have a longer side extending in the same direction as a direction in which the wiring layer 3 extends. The rectangular spaces 3a are equally spaced away from adjacent spaces, and arranged in a line. The spaces 3a are all the same in size, namely the spaces 3a have the same width S3 and the same height H3.

By forming the spaces 3a within the wiring layer 3, the wiring layer 3 is divided into two wiring layer segments 3b–1 and 3b–2 extending at opposite sides of the spaces 3a. Each of the wiring layer segments 3b–1 and 3b–2 extend in a line in the same direction as a direction in which the wiring layer 3 extends. The wiring layer segments 3b–1 and 3b–2 are connected with each other through connections 3c extending traversely between adjacent spaces 3a.

The wiring layer segments 3b–1 and 3b–2 are designed to have a width W3 which is equal to or smaller than the thickness T of the wiring layer 3. Thus, the wiring layer 3 is constituted of the wiring layer segments 3b–1 and 3b–2 both having a smaller width than the thickness T of the wiring layer 3.

For instance, assumed that the wiring layer 1 has a thickness T of 1μm and a width W5 of 3μm, the spaces 3a are designed to have a width S3 of 1μm or longer, and the wiring layer segments 3b–1 and 3b–2 are designed to have a width W6 of 1μm or smaller which is equal to or smaller than the thickness of 1μm.

Figure 5B:
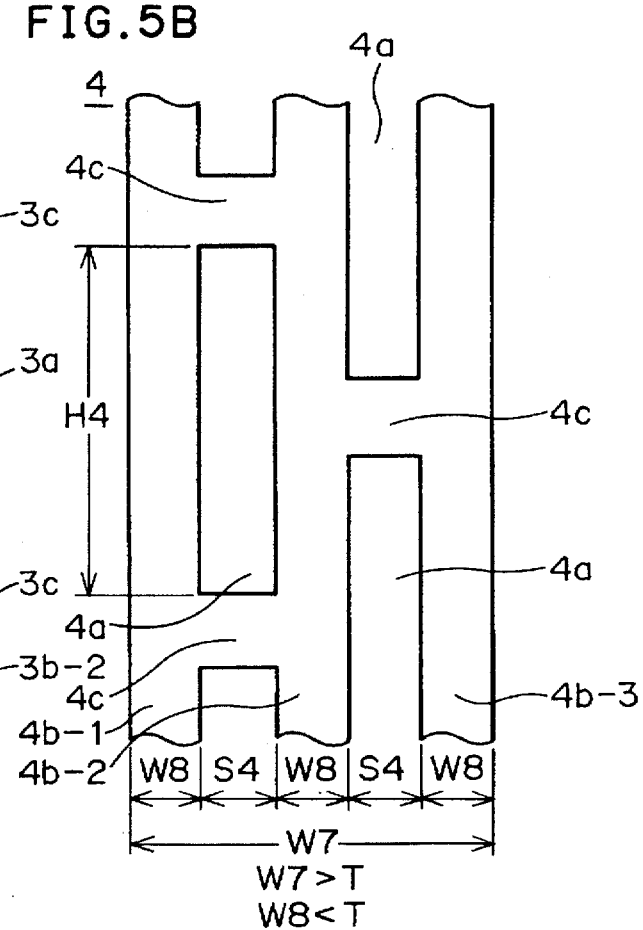
FIG. 5B is a top plan view illustrating a variant of the wiring layer illustrated in FIG. 5A.

FIG. 5B illustrates a variant of the second embodiment illustrated in FIG. 5A. An illustrated wiring layer 4 made of aluminum-copper alloy has a width W7 which is wider than the width W5 of the wiring layer 3 illustrated in FIG. 5A and which is further greater than a thickness T of the wiring layer 4. The wiring layer 4 is formed with a plurality of rectangular spaces 4a in a plurality of lines. The lines along which the rectangular spaces 4a are arranged are in parallel with each other, and in each of the lines, the spaces 4a are equally spaced away from adjacent spaces. The rectangular spaces 4a are all the same in size, namely the spaces 4a have the same width S4 and the same height H4. Each of the rectangular spaces 4a has a longer side extending in the same direction as a direction in which the wiring layer 4 extends, and a shorter side perpendicular to the longer side.

By forming the spaces 4a within the wiring layer 4, the wiring layer 4 is divided into three wiring layer segments 4b–1, 4b–2 and 4b–3 located at opposite sides of the spaces 4a. Each of the wiring layer segments 4b–1, 4b–2 and 4b–3 extend in a line in the same direction as a direction in which the wiring layer 4 extends. The wiring layer segments 4b–1, 4b–2 and 4b–3 are connected with each other through connections 4c traversely extending between the adjacent spaces 4a.

The spaces 4a in a line are arranged alternately with the spaces 4a in an adjacent line. Specifically, longitudinally center point of the spaces 2a in a certain line are in alignment with the connections 4c located in an adjacent line.

The wiring layer segments 4b–1, 4b–2 and 4b–3 are designed to have a width W8 which is equal to or smaller than the thickness T of the wiring layer 4. Thus, the wiring layer 4 is constituted of the wiring layer segments 4b–1, 4b–2 and 4b–3 each having a smaller width than the thickness of the wiring layer 4.

For instance, assumed that the wiring layer 4 has a thickness T of 1μm and a width W7 of 5μm, the spaces 4a are designed to have a width S4 of 1μm or longer, and the wiring layer segments 4b–1, 4b–2 and 4b–3 are designed to have a width W8 of 1μm or smaller which is equal to or smaller than the thickness T of 1μm.

In the variant illustrated in FIG. 5B, the wiring layer segments 4b–1, 4b–2 and 4b–3 are designed to have the same width W8 and the same height H4, but it should be noted that the wiring layer segments 4b–1, 4b–2 and 4b–3 may have different widths and heights from one another, as long as each of the widths of the wiring layer segments 4b–1, 4b–2 and 4b–3 is smaller than the thickness T of the wiring layer 4.

Figure 6A:
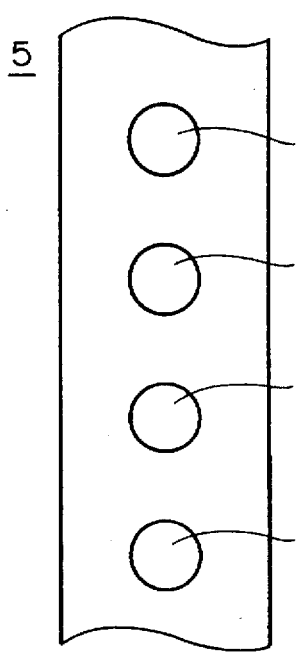
FIG. 6A is a top plan view illustrating a wiring layer in accordance with the third embodiment of the present invention.

FIG. 6A illustrates a wiring layer in a semiconductor device in accordance with the third embodiment of the present invention. An illustrated wiring layer 5 is the same as the wiring layer 1 illustrated in FIG. 3A except that there are formed circular spaces 5a in place of the square spaces 1a. The other structure of the wiring layer 5 is the same as the wiring layer 1.

For instance, assumed that the wiring layer 5 has a thickness of 1.5μm and a width of 3μm, the circular spaces 5a are designed to have a diameter of 1μm or greater, and the wiring layer segments are designed to have a width of 1 μm or smaller which is smaller than the thickness of 1.5μm.

Figure 6B:
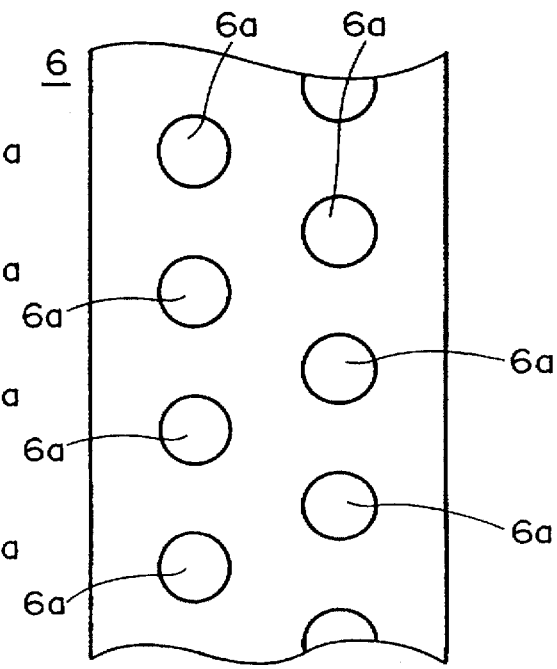
FIG. 6B is a top plan view illustrating a variant of the wiring layer illustrated in FIG. 6A.

FIG. 6B illustrates a variant of the second embodiment. If a wiring layer has a much greater width, there may be formed a plurality of lines of circular spaces, as illustrated in FIG. 6B. An illustrated wiring layer 6 is the same as the wiring layer 2 illustrated in FIG. 3B except that there are formed circular spaces 6a in place of the square spaces 2a.

For instance, assumed that the wiring layer 6 has a thickness of 1.5μm and a width 5μm, the circular spaces 6a are designed to have a diameter of 1μm or greater, and the wiring layer segments are designed to have a width of 1μm or smaller which is equal to or smaller than the thickness of 1.5μm.

In the wiring layers 5 and 6 illustrated in FIGS. 6A and 6B, respectively, there may be formed oval spaces in place of the circular spaces 5a and 6a, in which case, it is preferable that the oval spaces are designed to have a major axis extending in the same direction as a direction in which the wiring layers 5 and 6 extend.

FIGS. 7A to 7D illustrate respective steps of an inventive method of fabricating a semiconductor layer including a wiring layer divided into wiring layer segments.

Figure 7A:
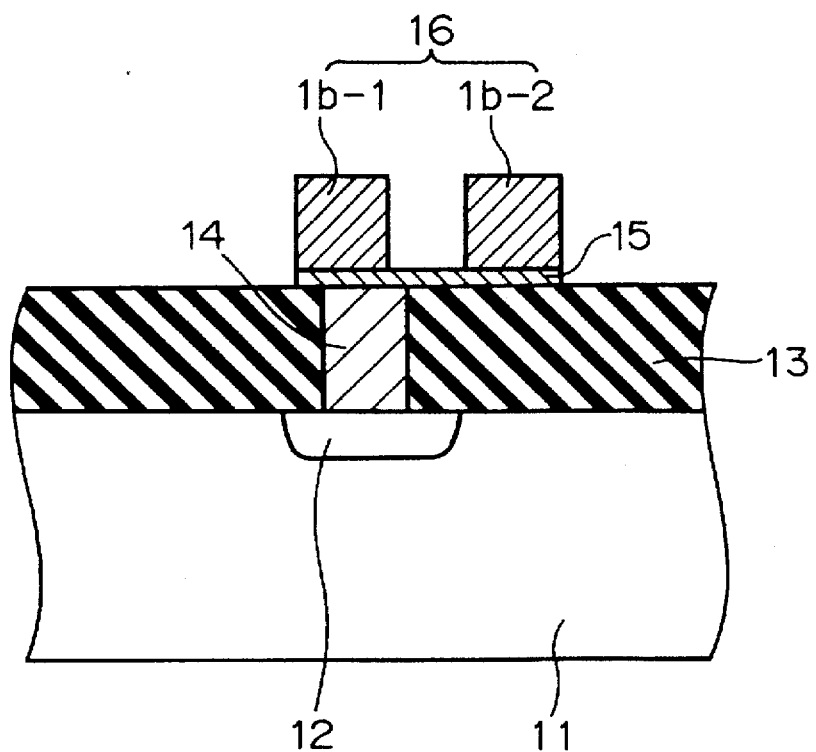
FIGS. 7A to 7D are cross-sectional views of a semiconductor device, illustrating respective steps of a method of fabricating the same in accordance with the present invention.

First, as illustrated in FIG. 7A, an n-type diffusion layer 12 is formed at a surface of a p-type silicon substrate 11. Then, a first interlayer insulating film 13 is formed on the p-type silicon substrate 11. The first interlayer insulating film 13 is a silicon dioxide film formed by means of thermal chemical vapor deposition (CVD).

Then, there is formed a contact hole throughout the first interlayer insulating film 13 above the diffusion layer 12. The contact hole is filled with refractory metal such as titanium (Ti) and tungsten (W) to thereby form a contact plug 14 as a first electrically conductive film.

Then, there is formed a contact pad 15 as a second electrically conductive film on the first interlayer insulating film 13 in electrical connection with the contact plug 14. The contact pad 15 is made of a titanium nitride film having a thickness of about 200 nm. It is necessary for the contact pad 15 to be located within a later mentioned through hole which is formed for connecting a lower wiring layer (mentioned later) to an upper wiring layer (mentioned later).

Then, as illustrated in FIG. 7A, a lower wiring layer 16 is formed on and in electrical connection with the contact pad 15. The lower wiring layer 16 is made of aluminum-copper alloy. Herein, the lower wiring layer 16 is constituted of the wiring layer segments 1b–1 and 1b–2 illustrated in FIG. 3A each of which has a width equal to or smaller than a thickness of the wiring layer 16.

Figure 7B:
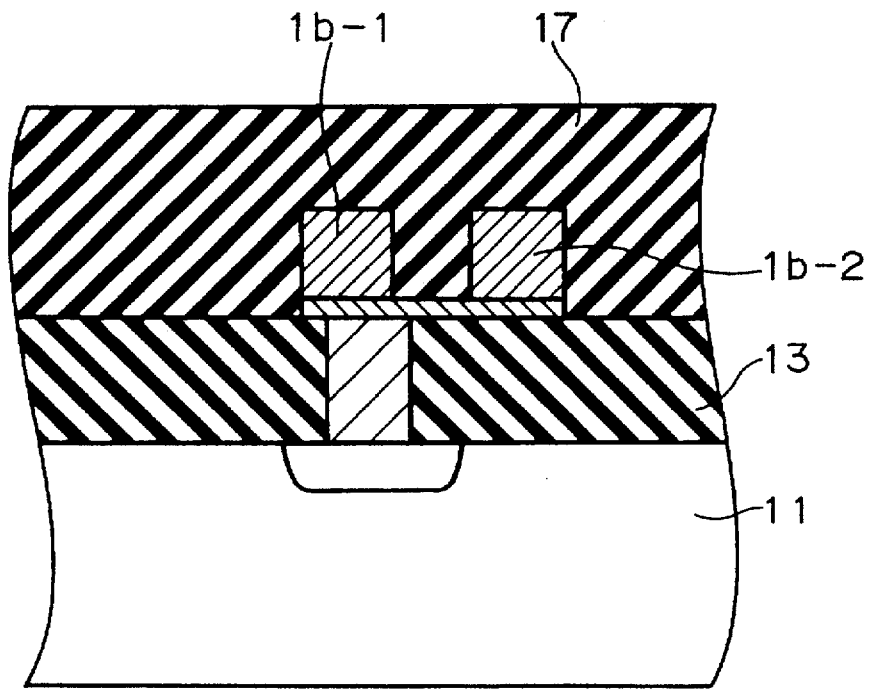

Then, as illustrated in FIG. 7B, a second interlayer insulating film 17 is deposited on the first interlayer insulating film 13, fully covering lower the wiring layer 16 therewith, by means of CVD employing bias ECR. The second interlayer insulating film 17 is made of silicon dioxide. As mentioned earlier with reference to FIGS. 4A and 4B, the second interlayer insulating film 17 is formed to have a completely flat surface without any projections even above the wiring layer segments 1b–1 and 1b–2, since the wiring layer segments 1b–1 and 1b–2 have a width equal to or smaller than a thickness of the lower wiring layer 16.

Figure 7C:
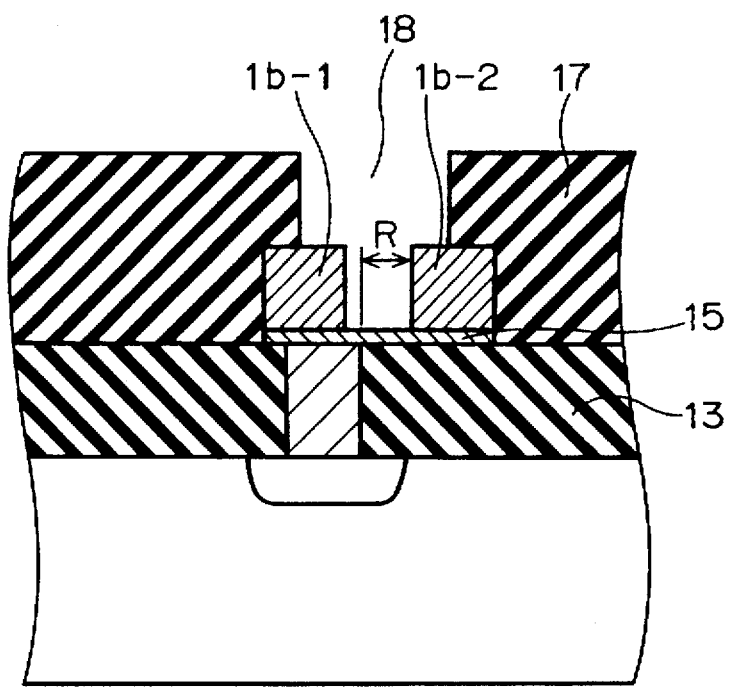

Then, as illustrated in FIG. 7C, there is formed a through hole 18 throughout the second interlayer insulating film 17 so that sidewalls and a part of upper surfaces of the wiring layer segments 1b–1 and 1b–2 appear. The through hole 18 is formed by dry-etching the second interlayer insulating film 17. In this dry-etching, the contact pad 15 works as an etching stopper for preventing the first interlayer insulating film 13 from being etched. To this end, the contact pad 15 is formed to have a width greater than a diameter of the through hole 18. As an alternative, the contact pad 15 may be formed only in a region indicated with "R" which region is not above the contact plug 14, but is within the through hole 18.

Figure 7D:
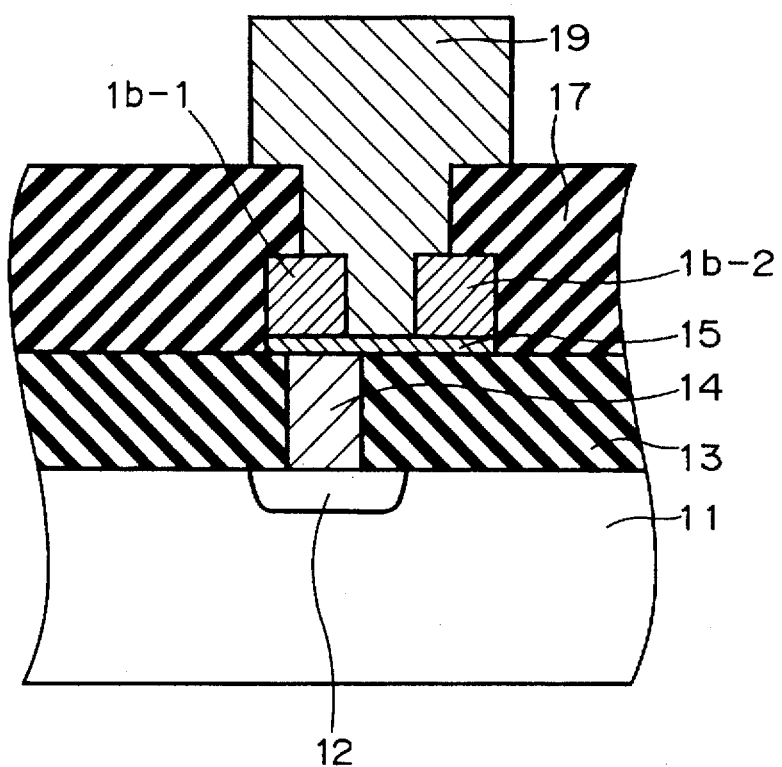

Then, as illustrated in FIG. 7D, an upper wiring layer 19 is formed filling the through hole 18 therewith. The thus formed upper wiring layer 19 makes contact with the wiring layer segments 1b–1 and 1b–2 within the through hole 18.

The lower wiring layer 16 constituted of the wiring layer segments 1b–1 and 1b–2 makes electrical contact with the diffusion layer 12 through the contact pad 15 and the contact plug 14, and further with the upper wiring layer 19. The lower wiring layer 16 makes electrical contact with the upper wiring layer 19 through sidewalls and a part of upper surfaces of the wiring layer segments 1b–1 and 1b–2. Hence, a contact area between the lower and upper wiring layers 16 and 19 is not decreased.

In addition, a wiring resistance at a contact area between the wiring layers 16 and 19 is not increased, since the wiring layer segments 1b–1 and 1b–2 constituting the lower wiring layer 16 make direct contact with the upper wiring layer 19.

In the above mentioned embodiments, the lower wiring layer 1 to 6 and 16 are made of aluminum-copper alloy. However, it should be noted that the present invention can be applied to a wiring layer made of refractory metal such as tungsten (W).

In the above mentioned embodiments, the second interlayer insulating film formed on the wiring layer segments is formed by means of bias sputtering or CVD employing bias ECR. However, it should be noted that the present invention can be applied to a method of forming an interlayer insulating film where deposition of the film and sputtering of the film are simultaneously carried out while the film is being formed.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-229130 filed on Aug. 29, 1996 including specification, claims, drawings and summary is incorporated herein by reference in its entirety.

What is claimed is:

1. A semiconductor device comprising:

(a) a semiconductor substrate;

(b) a diffusion layer formed in said semiconductor substrate and having electrical conductivity opposite to that of said semiconductor substrate;

(c) a first interlayer insulating film formed on said semiconductor substrate;

(d) a contact pad formed on said first interlayer insulating film;

(e) a contact plug formed throughout said first interlayer insulating film in a thickness-wise direction for electrically connecting said diffusion layer to said contact pad;

(f) a lower wiring layer having a thickness T and a width W1 greater than said thickness T, and formed on said contact plug, said wiring layer being divided into a plurality of wiring layer segments each of which has a width W2 equal to or smaller than said thickness T, said wiring layer being constituted of said wiring layer segments;

(g) a second interlayer insulating film formed covering said wiring layer segments therewith, said second interlayer insulating film being formed with a through hole through which sidewalls and a part of upper surfaces of said wiring layer segments are exposed; and (h) an upper wiring layer formed filling said through hole to make contact with said wiring layer segments at sidewalls and at least a part of upper surfaces thereof.

2. The semiconductor device as set forth in claim 1, wherein said contact pad is wider than said through hole.

3. The semiconductor device as set forth in claim 1, wherein said contact pad is formed so that said contact pad covers at least a region below which said contact plug does not exist, but on which said through hole exists and said wiring layer segments do not exist.

4. The semiconductor device as set forth in claim 1, wherein said wiring layer is separated with spaces where said wiring layer does not exist, to thereby define said wiring layer segments.

5. The semiconductor device as set forth in claim 1, wherein said second interlayer insulating film is made of a silicon dioxide film deposited by bias-ECR CVD.

6. The semiconductor device as set forth in claim 1, wherein said second interlayer insulating film is made of a silicon dioxide film deposited by bias sputtering.

7. The semiconductor device as set forth in claim 1, wherein said wiring layer segments have the same width.

8. The semiconductor device as set forth in claim 3, wherein said spaces are formed in a line.

9. The semiconductor device as set forth in claim 3, wherein said spaces are formed in lines arranged in parallel with each other.

10. The semiconductor device as set forth in claim 3, wherein said spaces are square in shape.

11. The semiconductor device as set forth in claim 3, wherein said spaces are circular in shape.

12. The semiconductor device as set forth in claim 3, wherein said spaces are rectangular in shape.

13. The semiconductor device as set forth in claim 3, wherein said spaces are oval in shape.

14. The semiconductor device as set forth in claim 3, wherein said spaces are composed of a combination of various shapes.

15. The semiconductor device as set forth in claim 3, wherein said wiring layer segments are arranged in a mesh.

16. The semiconductor device as set forth in claim 8, wherein spaces in a line are arranged alternately with spaces in an adjacent line.

* * * * *